(12) United States Patent
Budell et al.

(10) Patent No.: US 7,196,908 B2
(45) Date of Patent: Mar. 27, 2007

(54) DUAL PITCH CONTACT PAD FOOTPRINT FOR FLIP-CHIP CHIPS AND MODULES

(75) Inventors: Timothy W. Budell, Milton, VT (US); David B. Stone, Jericho, VT (US); Jerzy M. Zalesinski, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 481 days.

(21) Appl. No.: 10/455,982

(22) Filed: Jun. 5, 2003

(65) Prior Publication Data

US 2004/0246691 A1  Dec. 9, 2004

(51) Int. Cl.
  *H05K 7/10* (2006.01)
(52) U.S. Cl. .................................. 361/767
(58) Field of Classification Search .......... 174/260, 174/261; 257/786, 780; 361/777
See application file for complete search history.

(56) References Cited

U.S. PATENT DOCUMENTS

| | | | |
|---|---|---|---|
| 4,495,377 A | 1/1985 | Johnson et al. | |
| 5,324,985 A | 6/1994 | Hamada et al. | |
| 5,982,033 A * | 11/1999 | Ohsawa et al. | 257/737 |
| 6,107,685 A * | 8/2000 | Nishiyama | 257/737 |
| 6,162,997 A | 12/2000 | Memis | |
| 6,236,115 B1 * | 5/2001 | Gaynes et al. | 257/774 |
| 6,285,560 B1 | 9/2001 | Lyne | |
| 6,335,493 B1 | 1/2002 | Horiuchi et al. | |
| 6,650,014 B2 * | 11/2003 | Kariyazaki | 257/737 |

\* cited by examiner

*Primary Examiner*—Dean A. Reichard
*Assistant Examiner*—Ivan Carpio
(74) *Attorney, Agent, or Firm*—Schmeiser, Olsen & Watts; William H. Steinberg

(57) ABSTRACT

An electronic device, including: a plurality of contacts pads on a surface of a substrate; the contacts pads spaced apart a first predetermined distance in a first direction; and the contact pads spaced apart a second predetermined distance in a second direction, the first predetermined distance different from the second predetermined distance, the first direction perpendicular to the second direction.

20 Claims, 5 Drawing Sheets

DUAL PITCH CONTACT PAD FOOTPRINT FOR FLIP-CHIP CHIPS AND MODULES

FIELD OF THE INVENTION

The present invention relates to the field of integrated circuits; more specifically, it relates to a footprint for a flip-chip contact pad array module and corresponding integrated circuit chip.

BACKGROUND OF THE INVENTION

Typical high input/output (I/O) count flip-chip modules use multiple wiring layers for signal, power and ground I/O escape from under the chip to the pins of the module. Fabrication of multiple wiring layer modules is costly and time consuming. Any method to reduce the number of wiring layers without reducing I/O count would be welcome by the industry.

SUMMARY OF THE INVENTION

A first aspect of the present invention is an electronic device, comprising: a plurality of contacts pads on a surface of a substrate; the contacts pads spaced apart a first predetermined distance in a first direction; and the contact pads spaced apart a second predetermined distance in a second direction, the first predetermined distance different from the second predetermined distance, the first direction perpendicular to the second direction.

A second aspect of the present invention is a method of fabricating an electronic device, comprising: forming a plurality of contacts pads on a surface of a substrate; the contacts pads spaced apart a first predetermined distance in a first direction; and the contact pads spaced apart a second predetermined distance in a second direction, the first predetermined distance different from the second predetermined distance, the first direction perpendicular to the second direction.

A third aspect of the present invention is an electronic device comprising; an array of substrate contact pads on a surface of a substrate, the array of contact pads arranged in rows and columns of contact pads; the columns of substrate contact pads spaced apart a first predetermined distance in a first direction; the rows of substrate contact pads spaced apart a second predetermined distance in a second direction, the first predetermined distance different from the second predetermined distance, the first direction perpendicular to the second direction; and the array of contact pads aligned under an integrated circuit chip having a corresponding array of chip contact pads, corresponding substrate contact pads and chip contact pads electrically connected by controlled collapse chip connection.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

Figure 1:
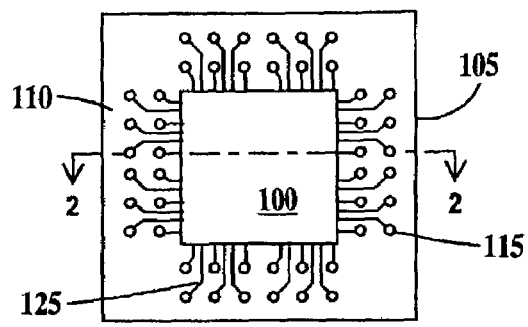
FIG. 1 is a plan view of an exemplary flip-chip module.

FIG. 1 is a top view of an exemplary flip-chip module. In FIG. 1, an integrated circuit chip 100 is flip-chip mounted to a module 105 having a multiplicity of pins 115. Each pin is electrically connected to a module contact pad 120 (see FIG. 2) by a conductive wire 125 within module 105. Conductive wires may also be formed on top surface 110 of module 105. Pins 115 may carry digital or analog signals, power or ground.

Figure 2:
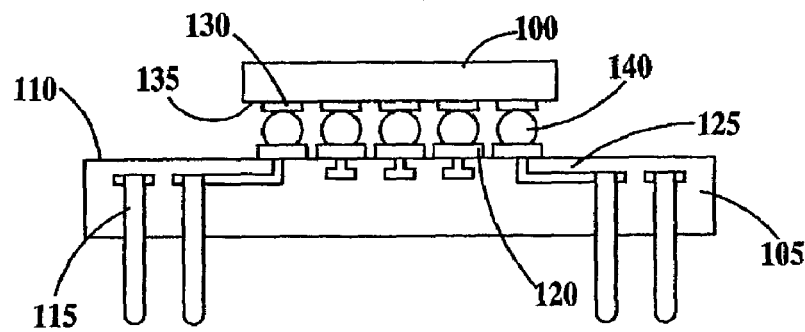
FIG. 2 is a cross-sectional view through line 2—2 of the flip chip module of FIG. 1.

FIG. 2 is a cross-sectional view through line 2—2 of the flip chip module of FIG. 1. FIG. 2 is at a larger scale than FIG. 1 in order to better illustrate the salient features of the interconnection between integrated circuit chip 100 and module 105. In FIG. 2, module contact pads 120 and mechanically and electrically connected to chip contact pads 130 on a top surface 135 of integrated circuit chip 100 by solder bumps, solder balls or controlled collapse chip connections (C4). The name flip-chip module as applied to the combination of integrated circuit chip 100 and module 105 is readily apparent as integrated circuit chip 100 has been "flipped" upside down so the top surface 135 of the integrated circuit chip is facing top surface 110 of module 105 in order to connect the integrated circuit chip 100 to the module.

While only one wiring layer is illustrated in FIGS. 1 and 2, the invention is applicable to modules having multiple wiring layers. For example, with two wiring layers, escaping wires in a second wiring layer would be positioned under the escaping wires of the first layer between columns of module contact pads. Alternatively, the first wiring layer may be on the surface of the module and the second wiring layer within the module. However, the invention reduces the number of wiring layers that would be required in a module from the number that would otherwise be required without the present invention as described infra. It should also be noted that while a pin grid array module has been illustrated in FIGS. 1 and 2, the present invention is applicable to other types of modules such as ball grid arrays, solder column grid arrays and land grid arrays.

Further, it should be noted that modules constitute only one type of substrate to which the present invention is applicable. Other types of substrates include but are not limited to, single wiring layer or multi-layer wiring layer integrated circuit chip modules, single wiring layer or multi-layer wiring layer printed circuit boards, single wiring layer or multi-layer wiring layer flexible circuit boards, single wiring layer or multi-layer wiring layer interposers, single wiring layer or multi-layer wiring layer ceramic substrates, single wiring layer or multi-layer wiring layer organic substrates and integrated circuit chips.

Contact pads and wires interconnecting contact pads may be formed by any number of methods well known in the art.

Figure 3:
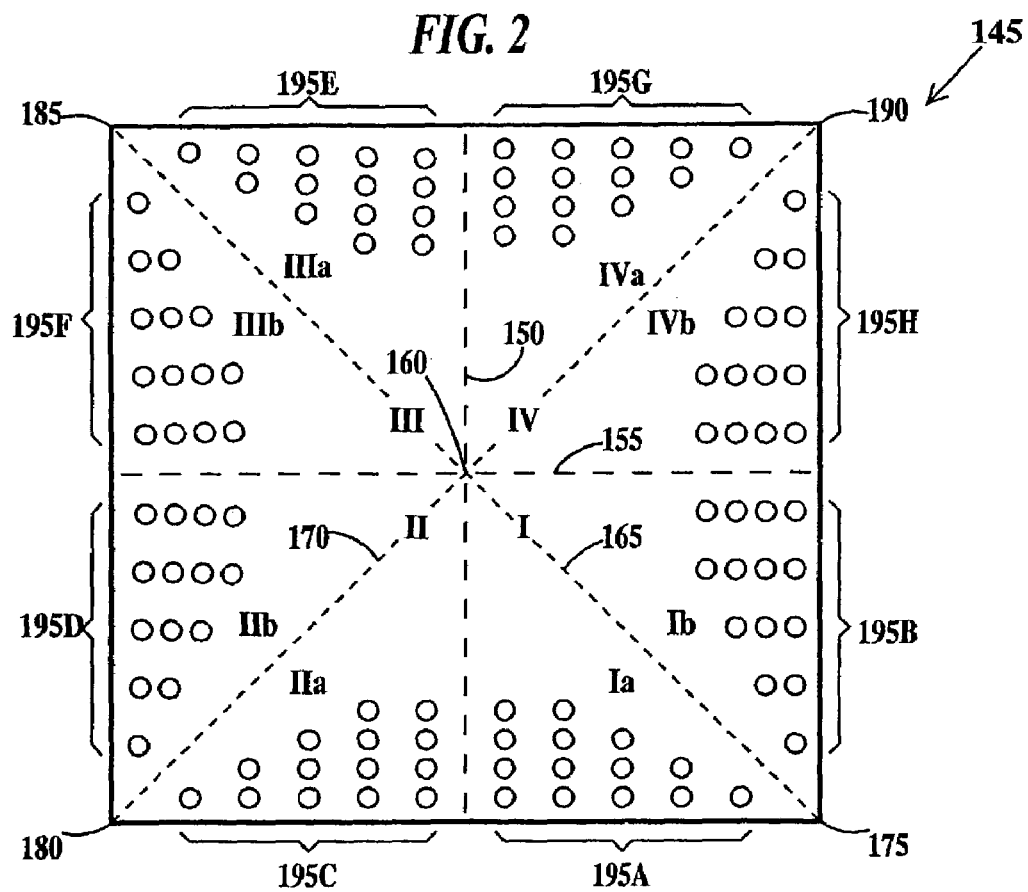
FIG. 3 is a plan view of an exemplary integrated circuit chip illustrating symmetry of a chip contact pad footprint according to the present invention.

FIG. 3 is a plan view of an exemplary integrated circuit chip illustrating symmetry of a chip contact pad footprint according to the present invention. In FIG. 3, integrated chip 145 is divided into four equal size quadrants labeled I, II, III and IV which are defined by a vertical axis 150 and a horizontal axis 155, the horizontal axis being perpendicular to the vertical axis and the two axes crossing at a center 160 of integrated circuit chip 145. Each quadrant I, II, III and IV is divided into two equal triangular sections defined by diagonal axes 165 and 170. Quadrant I is divided into a first section Ia and a second section Ib by diagonal axis 165 extending from center 160 to a first corner 175 of integrated circuit chip 145. Quadrant II is divided in to a first section IIa and a second section IIb by diagonal axis 170 extending from center 160 to a second corner 180 of integrated circuit chip 145. Quadrant III is divided in to a first section IIIa and a second section IIIb by diagonal axis 165 extending from center 160 to a third corner 185 of integrated circuit chip 145. Quadrant IV is divided in to a first section IVa and a second section IVb by diagonal axis 170 extending from center 160 to a fourth corner 190 of integrated circuit chip 145.

Exemplary contact pad footprint 195A in section Ia of quadrant I and exemplary contact pad footprint 195B in section Ib of quadrant I are symmetrical about diagonal axes 165. Exemplary contact pad footprint 195C in section IIa of quadrant II and exemplary contact pad footprint 195D in section IIb of quadrant II are symmetrical about diagonal axes 170. Exemplary contact pad footprint 195E in section IIIa of quadrant III and exemplary contact pad footprint 195F in section IIIb of quadrant III are symmetrical about diagonal axes 165. Exemplary contact pad footprint 195G in section IVa of quadrant IV and exemplary contact pad footprint 195H in section IVb of quadrant IV are symmetrical about diagonal axes 170. Additionally quadrants I and II are symmetrical about vertical axis 150, quadrants III and IV are symmetrical about vertical axis 150, quadrants I and IV are symmetrical about horizontal axis 155 and quadrants II and III are symmetrical about horizontal axis 155. Thus, in the present example, the contact pad footprint in only one quadrant (only one section of one quadrant if the quadrant is symmetrical about a diagonal axis) need be illustrated and described to fully disclose any particular embodiment of the entire contact pad footprint of an integrated chip or module according to the present invention and this approach will be taken in describing the present invention from hereon. However, the present invention is applicable to non-symmetrical footprints as well. Further, it should be readily apparent that the contact pad footprint on an integrated circuit chip is a mirror image of the corresponding contact pad footprint of the module, so when a chip contact pad footprint is described, the description is applicable to the corresponding module contact pad footprint and vice versa. The module contact pads may carry digital or analog signals, power or ground.

Figure 4:
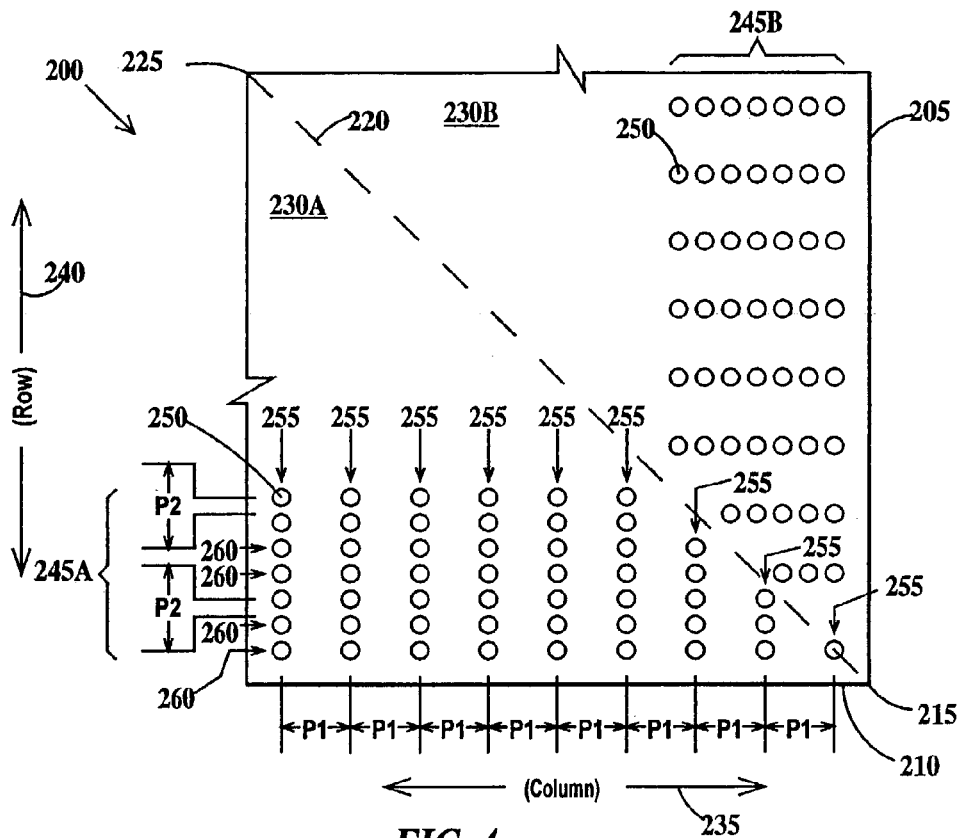
FIG. 4 is a plan view of one quadrant of an integrated circuit chip according to a first embodiment of the present invention.

FIG. 4 is a plan view of one quadrant of an integrated circuit chip according to a first embodiment of the present invention. In FIG. 4, an integrated chip quadrant 200 is defined by a first side 205 and a second side 210, perpendicular to and meeting the first side at a corner 215 of the integrated circuit chip quadrant. Integrated chip quadrant 200 corresponds to quadrant I of integrated circuit chip 145 in FIG. 3. A diagonal axis 220 extends from a center 225 of the whole integrated circuit chip of which integrated circuit chip quadrant 200 is one quadrant thereof, to corner 215 of the integrated circuit chip. Diagonal axis 220 divides the integrated circuit chip quadrant 200 into two equal sections 230A and 230B. First section 230A is bounded in part by second side 210 and second section 230B is bounded in part by first side 205. A horizontal axis 235 runs in the direction parallel to second side 210. Columns are defined as running perpendicular to an edge of the chip and rows are defined as running parallel to the of the chip.

In first section 230A, a first array 245A of chip contact pads 250 is arranged in a multiplicity of columns 255 and rows 260. Columns 255 are spaced apart on a pitch P1. Pitch is defined as a distance between centers of adjacent chip contact pads or between centers of adjacent module contact pads unless otherwise noted. Rows 260 are spaced apart on a pitch P2. P2 is less than P1. A second array 245B of chip contact pads 250 in second section 230B is a mirror image of first array of chip contact pads 245A about diagonal axis 220. First and second arrays 245A and 245B constitute one quarter of a full chip contact pad footprint. The full chip contact pad footprint is obtained by applying the symmetry rules described supra and illustrated in FIG. 3 to integrated circuit chip quadrant 200. Note in the present embodiment of the present invention, chip contact pads 250 are in a peripheral region (that area nearest sides 205 and 210) of integrated circuit chip quadrant 200 and an interior region (that area nearest center 225) contains no chip contact pads. Replicating integrated circuit chip quadrant 200 three times as described supra in reference to FIG. 3 will produce a full chip contact pad footprint. It should be pointed out that FIG. 4 also describes the corresponding module contact pad footprint. Because P1 is not equal to P2, the chip contact pad footprint (or the module contact pad footprint) of the present invention defines a dual pitch contact pad footprint.

Figure 5:
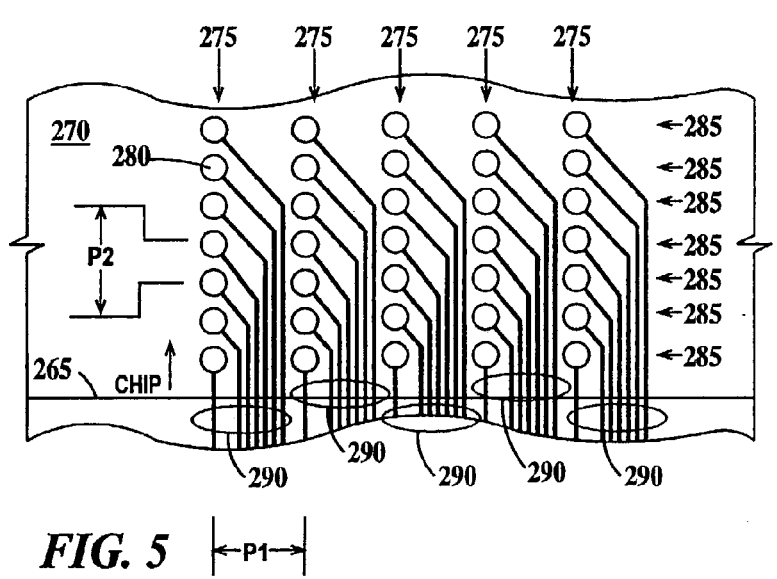
FIG. 5 is a plan view of a portion of a flip-chip module substrate having a module contact pad footprint corresponding to the chip contact pad footprint of FIG. 4.

FIG. 5 is a plan view of a portion of a flip-chip module substrate having a module contact pad footprint corresponding to the chip contact pad footprint of FIG. 4. In FIG. 5, a line 265 defines where a side of an integrated circuit chip aligns to module substrate 270 (for example side 210 in FIG. 4). Columns 275 of module contact pads 280 correspond, for example, to columns 255 in FIG. 4 and rows 285 of module contact pads 280 correspond, for example, to rows 260 of FIG. 4. Continuing the present example, columns 275 have the same pitch P1 as columns 255 in FIG. 4 and rows 285 have the same pitch P2 as rows 260 in FIG. 4. Connected to module contact pads 280 are module conductive wires 290. Conductive wires 290 have a minimum fabrication width and a minimum fabrication space. Pitch P1 is adjusted to a rule that requires P1 be at least large enough to accommodate the same number less one of conductive wires 290 of at least minimum width and spacing (greater than minimum widths and/or space may be used) as there are module contact pads 280 in each column 275. This rule maximizes the number of I/Os that can escape from under any given integrated chip per module wiring level. Pitch P2 conforms to a rule that states P2 can be no less than a minimum fabrication distance between the centers of two adjacent module contact pads. Particular values for pitch P1 increase if wires 290 are wider than minimum widths and/or the spaces between wires are greater than minimum spacing. Thus, pitches P1 and P2 as well as all subsequent pitches described infra, and based on module conductive wire width, module conductive wire space, module contact pad dimension and module contact pad spacing ground rules and not on integrated circuit chip ground rules. Note there is no requirement that the dimensions (i.e. diameter) of chip contact pads be the same as the dimensions (i.e. diameter) of module contact pads.

Figure 6:
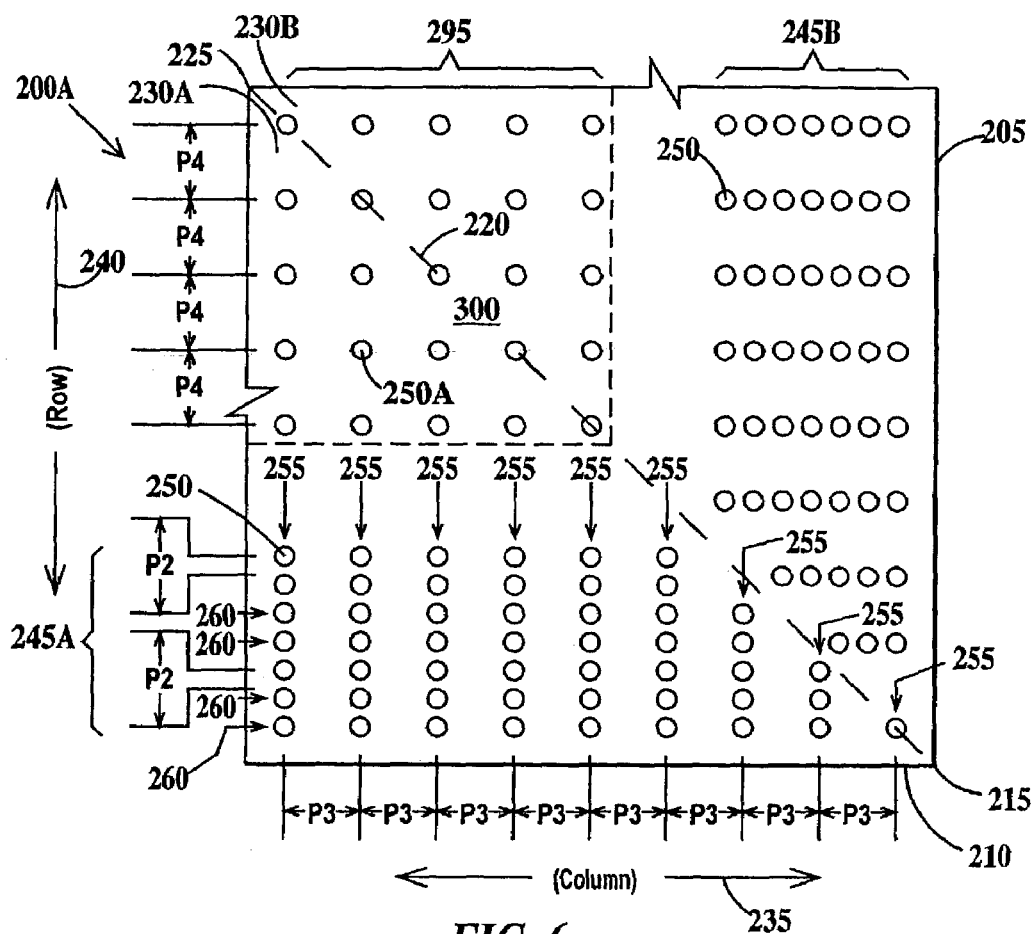
FIG. 6 is a plan view of one quadrant of an integrated circuit chip according to a second embodiment of the present invention.
Figure 7:
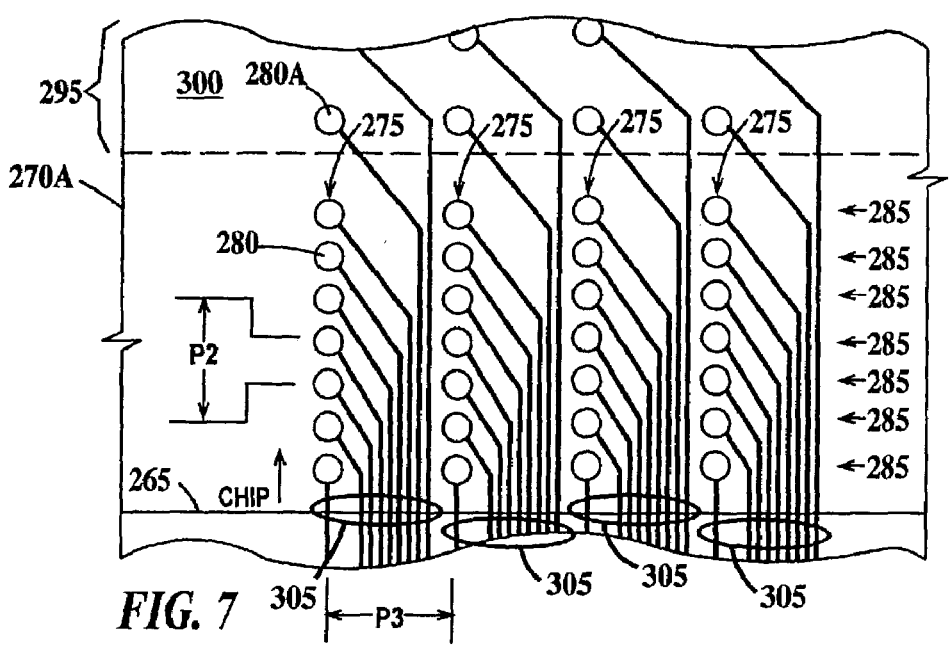
FIG. 7 is a plan view of a portion of a flip-chip module substrate having a module contact pad footprint corresponding to the chip contact pad footprint of FIG. 6.

FIG. 6 is a plan view of one quadrant of an integrated circuit chip according to a second embodiment of the present invention. In FIG. 6, an integrated circuit chip quadrant 200A is similar to integrated circuit chip quadrant 200 of FIG. 4 except for the addition of an array 295 of chip contact pads 250A in an interior region 300 of integrated circuit chip quadrant 200A. Rows of array 295 are spaced apart on a pitch P4 and columns of array 295 are spaced apart on a pitch P3. Pitch P3 is larger than pitch P1 of FIG. 4 to allow space for conductive wires from contact pads of array 295 to run between columns as illustrated in FIG. 7 and described infra. P4 may or may not be equal to P3. In one example, P4 is greater than P2.

FIG. 7 is a plan view of a portion of a flip-chip module substrate having a module contact pad footprint corresponding to the chip contact pad footprint of FIG. 6. In FIG. 7, line 265 defines where a side of an integrated circuit chip aligns to a module substrate 270A (for example side 210 in FIG. 6). Columns 275 of module contact pads 280 correspond, for example, to columns 255 in FIG. 6, and rows 285 of module contact pads 280 correspond, for example, to rows 260 of FIG. 6. Continuing the example, columns 275 have the same pitch P3 as columns 255 in FIG. 6, and rows 285 have the same pitch P2 as rows 260 in FIG. 6. Connected to module contact pads 280 and 280A are module conductive wires 305. Pitch P3 is adjusted to a rule that requires P3 be at least large enough to accommodate the same number less one of conductive wires 305 of at least minimum width and spacing (greater than minimum widths and/or space may be used) as there are module contact pads 280 in each column 275 plus an additional number of conductive wires from module contact pads 280A of array 295. The exact number of additional conductive wires being a function of the density of module contact pads in both interior and peripheral regions of the module contact pad footprint.

Figure 8:
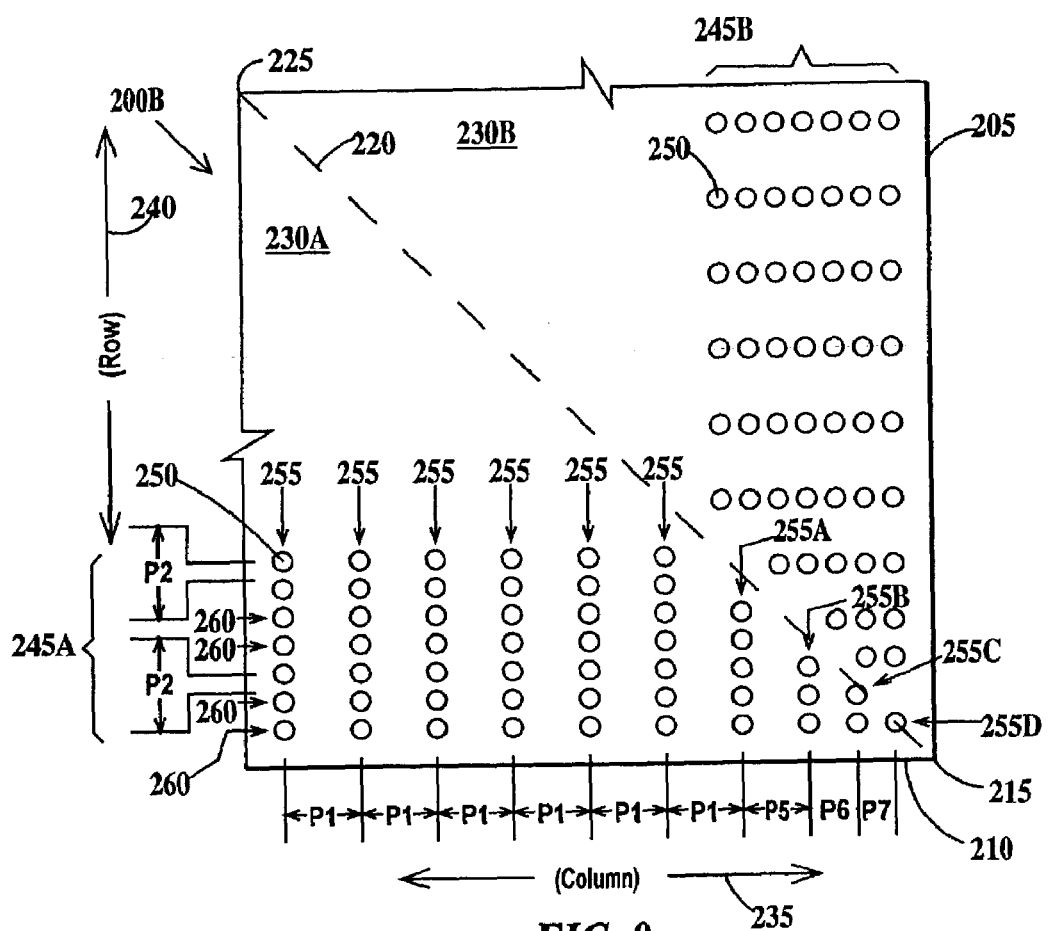
FIG. 8 is a plan view of one quadrant of an integrated circuit chip according to a third embodiment of the present invention.

FIG. 8 is a plan view of one quadrant of an integrated circuit chip according to a third embodiment of the present invention. In FIG. 8, an integrated circuit chip quadrant 200B is similar to integrated circuit chip quadrant 200 of FIG. 4 except the pitch of chip contact pad columns 255, 255A, 255B, 255C and 255D is variable, in that P5 is less than P1, P6 is less than P5, and P7 is less than P6. The pitch of columns 255 near corner 215 may be reduced because there are less conductive wires on/in an attached module to escape from under integrated circuit chip quadrant 200B near corner 215. Reduction of the value of the column-to-column spacing near the corners of the integrated chip and corresponding corners on the module allows for more chip contact pads and more corresponding module contact pads.

Figure 9:
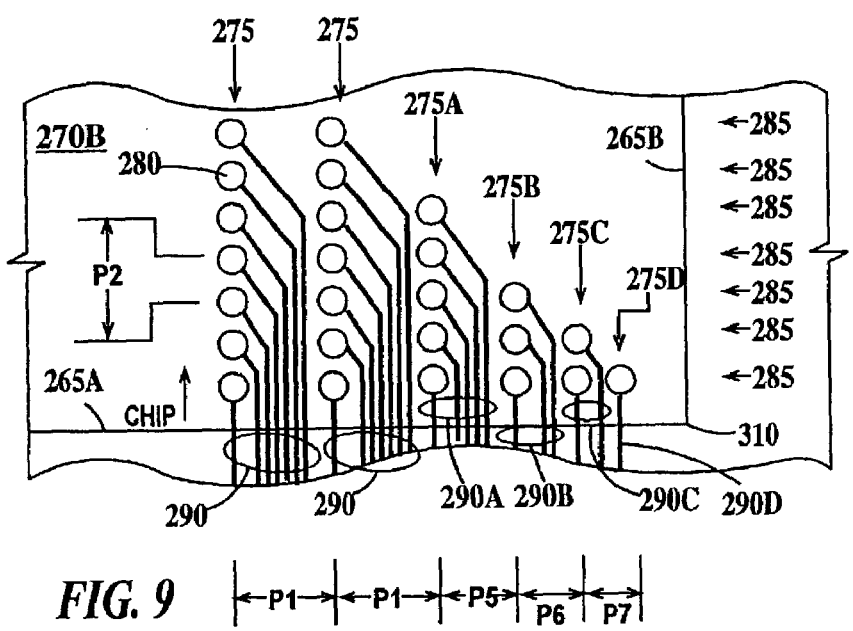
FIG. 9 is a plan view of a portion of a flip-chip module substrate having a module contact pad footprint corresponding to the chip contact pad footprint of FIG. 8.

FIG. 9 is a plan view of a portion of a flip-chip module substrate having a module contact pad footprint corresponding to the chip contact pad footprint of FIG. 8. In FIG. 9, lines 265A and 265B indicate where the sides of an integrated chip (for example sides 210 and 205 of FIG. 8) align to module substrate 270B. The number of conductive wires 290, 290A, 290B, 290C and 290D escaping between columns of module contact pads 275, 275A, 275B, 275C and 275D becomes progressively less the closer the columns are to "corner" 310.

Figure 10:
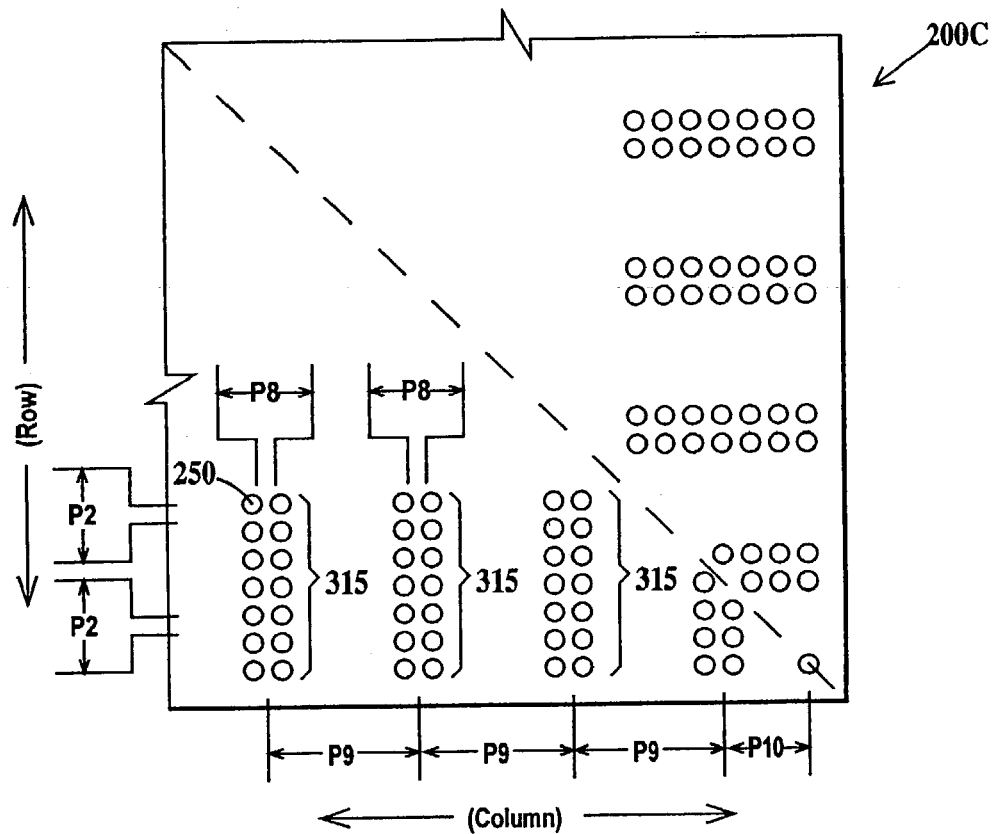
FIG. 10 is a plan view of one quadrant of an integrated circuit chip according to a fourth embodiment of the present invention.

FIG. 10 is a plan view of one quadrant of an integrated circuit chip according to a fourth embodiment of the present invention. In FIG. 10, an integrated circuit chip quadrant 200C is similar to integrated circuit chip quadrant 200 of FIG. 4 except that chip contact pads 250 are arranged in column pairs 315 instead of single columns. The chip contact pads 250 in each column pair are spaced apart on a pitch P8 and column pairs 315 are spaced apart on a pitch P9. Pitch P9 is measured from the centers of column pairs (not the centers of chip contact pads as for all other aforementioned pitches). Pitch P8 may or may not equal to pitch P2.

Figure 11:
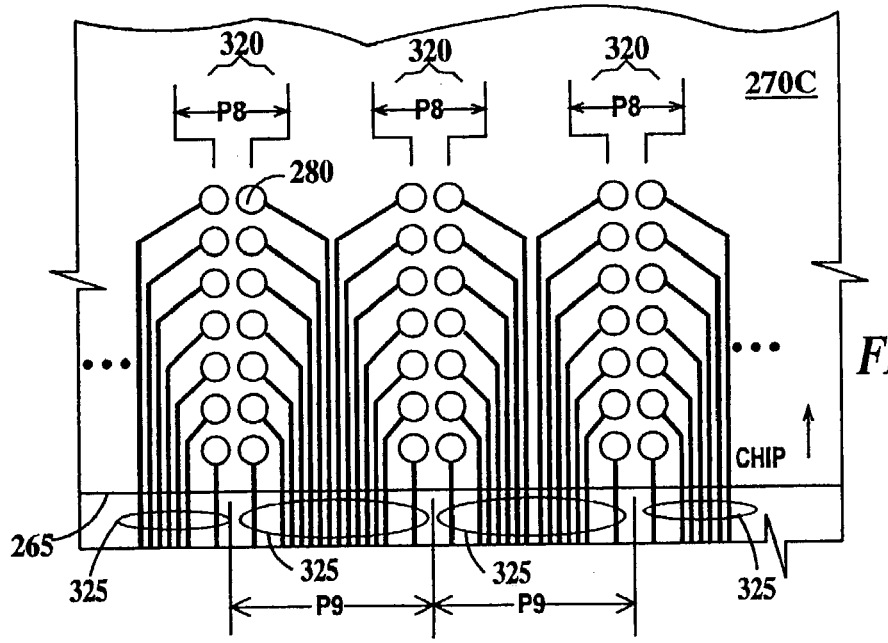
FIG. 11 is a plan view of a portion of a flip-chip module substrate having a module contact pad footprint corresponding to the chip contact pad footprint of FIG. 10.

FIG. 11 is a plan view of a portion of a flip-chip module substrate having a module contact pad footprint corresponding to the chip contact pad footprint of FIG. 10. In FIG. 11, column pairs 320 of module contact pads 280 correspond, for example, to column pairs 315 in FIG. 10. Continuing the example, column pairs 320 have the same pitch P9 as column pairs 315 in FIG. 10. Conductive wires 325 have a minimum fabrication width and a minimum fabrication space. Pitch P9 is adjusted to a rule that requires P9 be at least large enough to accommodate the same number less one of conductive wires 325 at least minimum width and spacing (greater than minimum widths and/or space may be used) as there are module contact pads 280 in each column pair 320. Pitch P8 is adjusted to be at least as large as the minimum fabrication distance between module contact pads 280.

The description of the embodiments of the present invention is given above for the understanding of the present invention. I twill be understood that the invention is not limited to the particular embodiments described herein, but is capable of various modifications, rearrangements and substitutions as will now become apparent to those skilled in the art without departing from the scope of the invention. For example, some module contact pads and corresponding chip contact pads may be used to electrically connect to power or ground planes within the module, in which case the spacing between columns of module and chip contact pads may be reduced since there are fewer signal wires to escape from each column. Therefore, it is intended that the following claims cover all such modifications and changes as fall within the true spirit and scope of the invention.

What is claimed is:

1. An electronic device, comprising:

a substrate having an interior region having first, second, third, and fourth sides and a peripheral region having corresponding first, second, third and fourth edges, said first side opposite said second side, said third side opposite said fourth side each edge parallel to a corresponding side, and a center equidistant from said first and second sides and equidistant from said third and fourth sides, a first region of said interior region of said substrate defined by said first side and first and second diagonal lines from opposite ends of said first side to said center;

a plurality of contacts pads arranged in rows and columns of contact pads on a surface of said interior region of said substrate, said rows of contact pads parallel to said first side, said columns of contact pads perpendicular to said rows;

all adjacent columns of said columns of contacts pads spaced apart a same first predetermined distance;

each of said rows of contact pads spaced apart a second predetermined distance, said first predetermined distance greater than said second predetermined distance; and except for contact pads immediately adjacent to said first side of said interior region of said substrate, each contact pad in each column of contact pads that is electrically connected to any wire is electrically connected to a wire that passes between contact pads of a column of contact pads that includes the contact pad to which said wire is connected and an adjacent column of said columns of contact pads and that crosses said first side of said interior region of said substrate.

2. The device of claim 1, wherein said contact pads are adapted for solder bump, solder ball or controlled collapse chip connection attachment to a flip-chip mounted chip.

3. The device of claim 1, wherein said substrate is selected from the group consisting of single wiring layer or multi-layer wiring layer integrated circuit chip modules, single wiring layer or multi-layer wiring layer printed circuit boards, single wiring layer or multi-layer wiring layer flexible circuit boards, single wiring layer or multi-layer wiring layer interposers, single wiring layer or multi-layer wiring layer ceramic substrates, single wiring layer or multi-layer wiring layer organic substrates and integrated circuit chips.

4. The device of claim 1, further comprising:
said rows and columns of contact pads aligned under an integrated circuit chip having a corresponding rows and columns of chip contact pads, corresponding substrate contact pads and chip contact pads electrically connected by controlled collapse chip connections.

5. The device of claim 1, further including:
a second region of said substrate defined by said second side and third and fourth diagonal lines from opposite ends of said second side to said center;
a third region of said substrate defined by said third side and said first and third diagonal lines from opposite ends of said third side to said center;
a fourth region of said substrate defined by said fourth side and second and fourth diagonal lines from opposite ends of said fourth side to said center;
said second, third and fourth regions of said substrate having arrangements of contact pads defined by clockwise rotation of said first region by 180°, 90° and 270° respectively.

6. The module of claim 1, further including:
an additional plurality of contacts pads arranged on said surface of said region of said module in additional rows of contact pads and the same columns as said plurality of contacts pads, said additional rows of contact pads parallel to said first side; and
each row of said additional plurality of contact pads spaced apart a third predetermined distance, said third predetermined distance greater than said second predetermined distance, said plurality of contact pads located between said additional plurality of contact pads and said first side.

7. The module of claim 6, wherein said first and third predetermined distances are the same distance.

8. A method of fabricating an electronic device, comprising:
providing a substrate having an interior region having first, second, third, and fourth sides and a peripheral region having corresponding first, second, third and fourth edges, said first side opposite said second side, said third side opposite said fourth side each edge parallel to a corresponding side, and a center equidistant from said first and second sides and equidistant from said third and fourth sides, a first region of said interior region of said substrate defined by said first side and first and second diagonal lines from opposite ends of said first side to said center;

forming a plurality of contacts pads arranged in rows and columns of contact pads on a surface of said interior region of said substrate, said rows of contact pads parallel to said first side, said columns of contact pads perpendicular to said rows;

spacing apart all adjacent columns of said columns of contacts pads a same first predetermined distance;

spacing apart each of said rows of contact pads spaced a second predetermined distance, said first predetermined distance greater than said second predetermined distance;

wherein except for contact pads immediately adjacent to said first side of said interior region of said substrate, each contact pad in each column of contact pads that is electrically connected to any wire is electrically connected to a wire that passes between contact pads of a column of contact pads that includes the contact pad to which said wire is connected and an adjacent column of said columns of contact pads and that crosses said first side of said interior region of said substrate.

9. The method of claim 8, wherein said contact pads are adapted for solder bump, solder ball or controlled collapse chip connection attachment to a flip-chip mounted chip.

10. The method of claim 8, wherein said substrate is selected from the group consisting of single wiring layer or multi-layer wiring layer integrated circuit chip modules, single wiring layer or multi-layer wiring layer printed circuit boards, single wiring layer or multi-layer wiring layer flexible circuit boards, single wiring layer or multi-layer wiring layer interposers, single wiring layer or multi-layer wiring layer ceramic substrates, single wiring layer or multi-layer wiring layer organic substrates and integrated circuit chips.

11. The method of claim 8, said substrate further including:
a second region of said substrate defined by said second side and third and fourth diagonal lines from opposite ends of said second side to said center;
a third region of said substrate defined by said third side and said first third and third diagonal lines from opposite ends of said third side to said center;
a fourth region of said substrate defined by said fourth side and second and fourth diagonal lines from opposite ends of said fourth side to said center;
said second, third and fourth regions of said substrate having arrangements of contact pads defined by clockwise rotation of said first region by 180°, 90° and 270° respectively.

12. The method of claim 8, further including:
aligning said rows and columns of contact pads under an integrated circuit chip having a corresponding rows and columns of chip contact pads; and
electrically connecting corresponding substrate contact pads and chip contact pads using controlled collapse chip connections.

13. The method of claim 8, further including:
forming an additional plurality of contacts pads arranged on said surface of said region of said module in additional rows of contact pads and the same columns as said plurality of contacts pads, said additional rows of contact pads parallel to said first side, said plurality of contact pads located between said additional plurality of contact pads and said first side; and spacing apart each row of said additional plurality of contact pads a third predetermined distance, said third predetermined distance greater than said second predetermined distance.

14. The method of claim 13, wherein said first and third predetermined distances are the same distance.

15. An electronic device, comprising:
a substrate having first, second, third, and fourth sides, said first side opposite said second side, said third side opposite said fourth side, and a center equidistant from said first and second sides and equidistant from said third and fourth sides, a first region of said substrate defined by said first side and first and second diagonal lines from opposite ends of said first side to said center;
a plurality of contacts pads arranged in rows and columns of contact pads on a surface of said region of said substrate, said rows of contact pads parallel to said first side, said columns of contact pads perpendicular to said rows, a number of contact pads in each column of contact pads varying;
at least three different adjacent pairs of said columns of contacts pads spaced apart at least three different distances, a distance any two adjacent columns are spaced apart based on a number of all contact pads in one of said any two adjacent columns; and
each of said rows of contact pads spaced apart a predetermined distance, at least two of said at least three different distances different from said predetermined distance.

16. A method of fabricating an electronic device, comprising:
providing a substrate having first, second, third, and fourth sides, said first side opposite said second side, said third side opposite said fourth side, and a center equidistant from said first and second sides and equidistant from said third and fourth sides, a first region of said substrate defined by said first side and first and second diagonal lines from opposite ends of said first side to said center;
forming a plurality of contacts pads arranged in rows and columns of contact pads on a surface of said region of said substrate, said rows of contact pads parallel to said first side, said columns of contact pads perpendicular to said rows, a number of contact pads in each column of contact pads varying;
spacing apart at least three different adjacent pairs of said columns of contacts pads at least three different distances, a distance any two adjacent columns are spaced apart based on a number of all contact pads in one of said any two adjacent columns; and
spacing apart each of said rows of contact pads spaced apart a predetermined distance, at least two of said at least three different distances different from said predetermined distance.

17. An electronic device, comprising: a substrate having first, second, third, and fourth sides, said first side opposite said second side, said third side opposite said fourth side, and a center equidistant from said first and second sides and equidistant from said third and fourth sides, a first region of said substrate defined by said first side and first and second diagonal lines form opposite ends of said first side to said center; a plurality of contacts pads arranged in rows of contact pads and double columns of contact pads on a surface of said regions of said substrate, said rows of contacts pads parallel to said first side, said columns of contact pads perpendicular to said rows; adjacent double columns of said double columns of contact pads spaced apart a same first predetermined distance, columns within each of said double columns of contact pads spaced apart a second predetermined distant, said first predetermined distance greater than said second predetermined distance; and each of said rows of contact pads spaced apart either a third or a fourth predetermined distance, said third predetermined distance different from said first predetermined distance.

18. The device of claim 17, wherein said first predetermined distance is sufficient to position, between each adjacent double column of contact pads, a number of conductive wires that is two less than half a number of all contact pads in corresponding adjacent pairs of double columns of contact pads to which said conductive wires are electrically connected.

19. A method of fabricating an electronic device, comprising; providing a substrate having first, second, third, and fourth sides, said first side opposite said second side, said third side opposite said fourth side, and a center equidistant from said first and second sides and equidistant from said third and fourth sides, a first region of said substrate defined by said first side and first and second diagonal lines form opposite ends of said first side to said center; forming a plurality of contacts pads arranged in rows of contact pads and double columns of contact pads on a surface of said regions of said substrate, said rows of contacts pads parallel to said first side, said columns of contact pads perpendicular to said rows; adjacent double columns of said double columns of contact pads spaced apart a same first predetermined distance, columns within each of said double columns of contact pads spaced apart a second predetermined distant, said first predetermined distance greater than said second predetermined distance; and each of said rows of contact pads spaced apart either a second or a third predetermined distance, said second predetermined distance different from said first predetermined distance.

20. The method of claim 19, wherein said first predetermined distance is sufficient to position, between each adjacent double column of contact pads, a number of conductive wires that is two less than half a number of all contact pads in corresponding adjacent pairs of double columns of contact pads to which said conductive wires are electrically connected.

* * * * *